United States Patent
Khazhinsky et al.

(10) Patent No.: US 6,500,723 B1
(45) Date of Patent: Dec. 31, 2002

(54) METHOD FOR FORMING A WELL UNDER ISOLATION AND STRUCTURE THEREOF

(75) Inventors: Michael G. Khazhinsky, Austin, TX (US); Aykut Dengi, Tempe, AZ (US); James W. Miller, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/972,397

(22) Filed: Oct. 5, 2001

(51) Int. Cl.[7] .................. H01L 21/20; H01L 21/76; H01L 21/336; H01L 21/425
(52) U.S. Cl. ............... 438/382; 438/298; 438/383; 438/450; 438/526; 438/530; 438/947
(58) Field of Search ................ 438/223, 224, 438/227, 228, 238, 298, 381, 382, 383, 384, 433, 526, 530, 947, 450

(56) References Cited

U.S. PATENT DOCUMENTS

| | | | | |
|---|---|---|---|---|
| 5,308,786 A | * | 5/1994 | Lur et al. | 438/427 |
| 5,736,445 A | * | 4/1998 | Pfirsch | 438/275 |
| 5,998,266 A | * | 12/1999 | So | 438/270 |
| 6,001,663 A | * | 12/1999 | Ling et al. | 438/17 |
| 6,063,659 A | * | 5/2000 | Le | 438/250 |
| 6,133,126 A | | 10/2000 | Reisinger et al. | 438/564 |
| 6,190,987 B1 | * | 2/2001 | Kasai et al. | 438/381 |
| 6,362,067 B1 | * | 3/2002 | Hall | 438/382 |
| 6,376,321 B1 | * | 4/2002 | Popovic et al. | 438/305 |

FOREIGN PATENT DOCUMENTS

| | | | | |
|---|---|---|---|---|
| JP | 2-051263 | * | 2/1990 | H01L/027/04 |
| JP | 2000195944 | * | 7/2000 | H01L/021/762 |

OTHER PUBLICATIONS

Tommy M.L. Lai et al., "Implementation Of Linear Doping Profiles For High Voltage Thin–Film SOI Devices", Proceedings of 1995 Int'l. Symposium on Power Semiconductor Devices & ICs, Yokohama, pgs. 315–320.

* cited by examiner

*Primary Examiner*—Carl Whitehead, Jr.
*Assistant Examiner*—Janice M. Thomas
(74) *Attorney, Agent, or Firm*—Kim-Marie Vo; James L. Clingan, Jr.

(57) ABSTRACT

A number of small wells under the isolation layer are formed using the same mask made of photoresist and implant step that is used for the regular wells. The small wells are formed close enough together so that they merge during normal subsequent semiconductor processing to form a merged well. The normal wells and the small wells have a concentration that is greater than that of the merged well. The desired merging of the small wells is ensured by making sure that the small wells are sufficiently close together that the normal diffusion of well implants, which occurs from the particular semiconductor process that is being used, results in the merging. One desirable use of the merged well, with its lower doping concentration, is as a resistor that has more resistance than that of the regular well without requiring an additional implant.

19 Claims, 3 Drawing Sheets

METHOD FOR FORMING A WELL UNDER ISOLATION AND STRUCTURE THEREOF

FIELD OF THE INVENTION

The invention relates generally to the field of semiconductor manufacturing and more specifically to wells under a trench isolation layer.

RELATED ART

For electrostatic discharge (ESD) protection circuit, high value resistors are often required. In order to achieve such resistance values, well resistors, formed from implanted well regions underneath thin isolation layers, are often used. These well regions exhibit a characteristic sheet resistance, typically defined in units of ohms per square. Typically, well resistor layouts are formed in a rectangular shape. The length to width ratio of each resistor is chosen based upon the targeted total resistance value. Length is defined as the dimension parallel to the current flow, width is the dimension perpendicular to the current flow. The minimum width of each resistor is chosen in order to attain repeatable well sheet resistance. By increasing the resistivity of the well region the area of the resistor could decrease thereby saving a significant amount of real estate of the integrated circuit, which leads to cost savings. One way to increase the resistivity is to perform multiple ion implantation steps using various well doses for different regions of the integrated circuit. However, this results in additional patterning and masking steps, thereby, increasing cycle time and cost of manufacturing. Therefore, there is a need for a process that increases the resistivity of the well region without increasing cycle time and cost.

BRIEF DESCRIPTION OF THE DRAWINGS

The present invention is illustrated by way of example and not limited in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Figure 1:
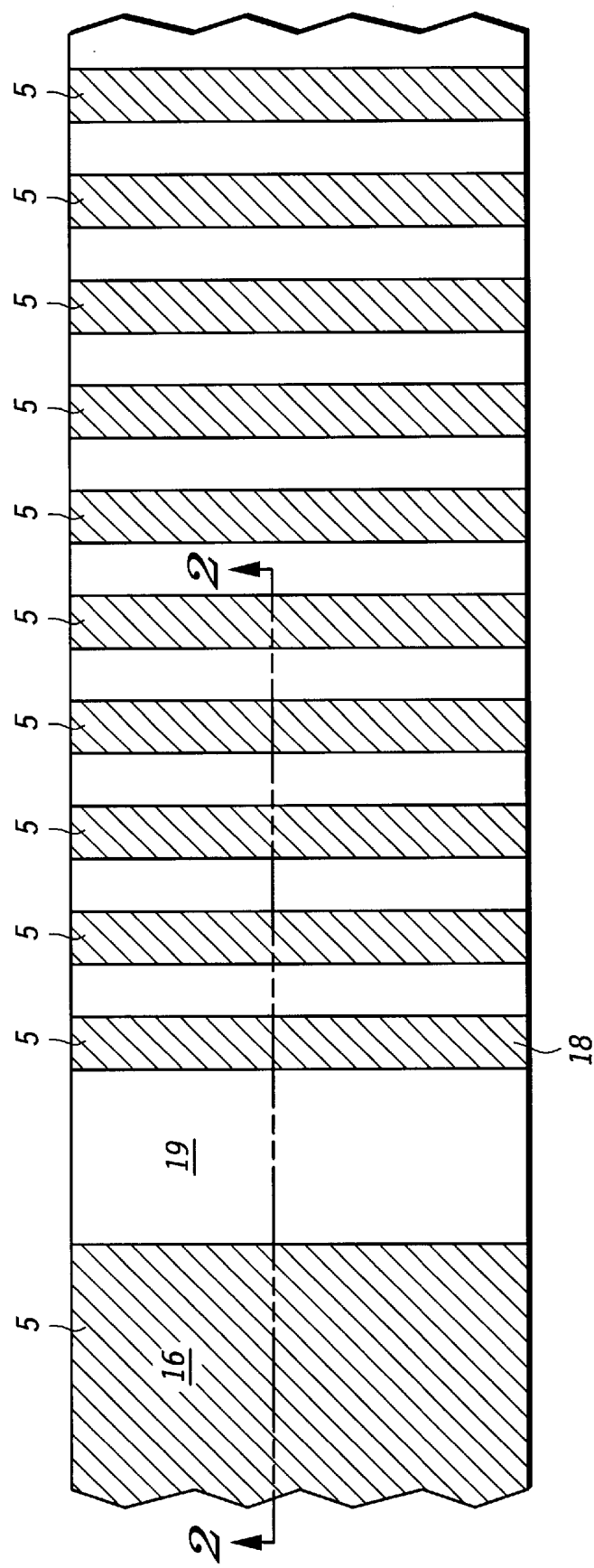
FIG. 1 illustrates a top view of a portion of a resistor in accordance with one embodiment of the present invention.

A resistor is formed in a substrate having an isolation region overlying semiconductor layer by a process that provides a lateral diffusion of well implants of at least a first dimension. A patterned photoresist layer with a plurality of photoresist features is used as a mask for forming doped regions. During subsequent processes, heat is applied to cause the doped region to merge and form a resistor. Therefore, the width of the photoresist features 18 is limited by the amount of lateral diffusion of the implanted species. In order for high resistivity to be achieved, the implanted species diffuses in order to merge adjacent implant regions 20 and form the merged well 22. Thus, the dopant species should diffuse at least half the width of the photoresist patterned feature 18. FIG. 1 illustrates a top view of a portion of a semiconductor device 100 including an isolation area 16, a contact opening 19, and a patterned photoresist layer 5 with a plurality of photoresist features 18 used to form a resistor in a well. The plurality of photoresist features 18 act as a mask in forming a plurality of well regions, which are subjected to heat and form a merged well, as will be subsequently described in more detail. Each photoresist feature 18 has a length dimension and a width dimension. (Although not shown, photoresist may be present in other areas of the semiconductor device 100 to prevent the formation of well implants in these areas, as will become apparent below.) Although the photoresist features 18 need not be equidistant from each other, the plurality of photoresist features 18, in one embodiment, are equally spaced apart from each other. This spacing may be the same distance as the width of each photoresist feature. In one embodiment, the spacing between the photoresist features 18 is less than approximately 0.5 microns or more specifically, approximately 0.36 microns. In another embodiment, the width of the photoresist features 18 is greater than the spacing between the photoresist features 18. For example, the ratio of the feature width to the space in between the features can be 1:1.5. The width dimension of each photoresist feature 18 depends on the photolithography technology and process being used. As explained later in more detail, the photoresist features 18 need to be small enough so that when annealing doped areas around the photoresist features 18, the dopants merge underneath the photoresist features 18. It has been shown that by using light with a wavelength of approximately 365 nanometers, a width of approximately 0.36 microns for the photoresist features 18 is sufficient.

In all embodiments it is not necessary for each photoresist patterned feature 18 to be identical to others. For example, the width of one photoresist patterned feature 18 could be greater than another photoresist patterned feature within the same array.

In FIG. 1, the photoresist features 18 are all rectangles in a row. Other patterns of the photoresist features 18, however, can be used. For example, the photoresist features 18 can be a checkerboard array of squares or rectangles.

Next to the plurality of photoresist features 18 is the photoresist or contact opening 19, where active features, such as a contact, will be formed during subsequent processing. A portion of unpatterned photoresist is used to form the isolation area 16 adjacent to the area where the active features will be formed. The formation of the resistor and adjacent areas is better understood by turning to FIGS. 2–4.

Figure 2:
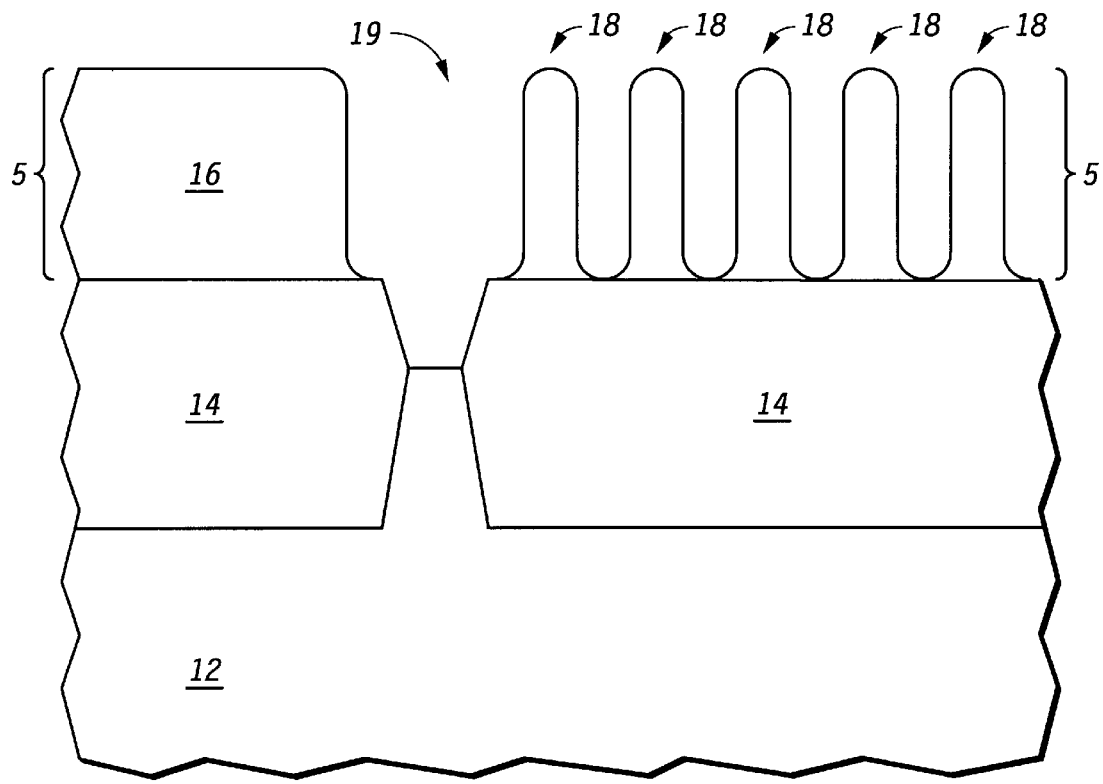
FIG. 2 illustrates a portion of a substrate during patterning in accordance with one embodiment of the present invention.

Shown in FIG. 2 is the semiconductor device 100 including an isolation layer 14 and the photoresist layer 5 formed over a substrate 12. The substrate 12 is a semiconductor substrate and can be silicon, silicon germanium, gallium arsenide, or the like. In addition, the substrate 12 can include a silicon substrate with an epitaxial silicon layer grown above the substrate 12. The isolation layer 14 is formed over the substrate 12, generally, by a deposition process such as chemical vapor deposition (CVD), physical vapor deposition (PVD), the like, or combinations of the above. The isolation layer 14 can be an oxide or any other suitable insulating material. In a preferred embodiment, the isolation layer 14 is a silicon dioxide layer formed using tetraethylorthosilane (TEOS). In one embodiment, the isolation layer 14 is at least 1 micron in thickness, but, more specifically, the isolation layer 14 is approximately 3.5 microns. After the photoresist layer 5 is deposited and patterned, the isolation layer 14 is etched to form the isolation area (non-patterned region) 16, the contact opening (photoresist active opening) 19 and the photoresist features 18.

Figure 3:
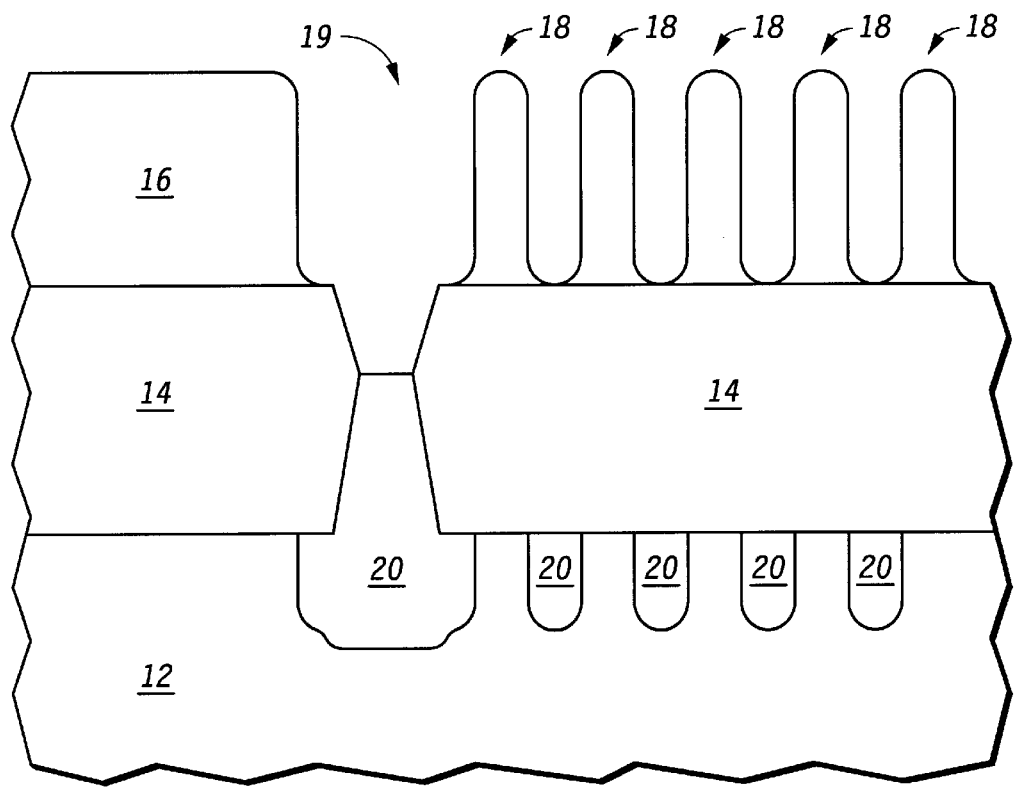
FIG. 3 illustrates the portion of the substrate in FIG. 2 after ion implantation in accordance with one embodiment of the present invention.

Shown in FIG. 3, the photoresist features 18 define areas blocked from well implants by ion implantation. The ion implantation process results in well regions 20, which are also referred to as implant regions 20. If the substrate 12 is a P-type substrate an ion implantation of dopants are used to make N-well regions. In one embodiment, phosphorous is used as the ions if the substrate 12 is already P-type. Since the ions need to penetrate through the isolation layer 14 which is very thick, an energy greater than 500 keV, or more specifically, greater than 600 keV, is used. The dosage used for the ion implantation will determine the sheet resistivity of the subsequently formed merged well. It has been found that using phosphorous at a high dosage of 7.2E 13 atoms per centimeter squared and an energy of 740 keV yields good results.

In one embodiment, the distance from the top of the isolation layer 14 to the bottom of the well region 20 under the contact opening 19 is approximately 1–3 microns. In one embodiment, the well regions 20 under the isolation area 14 are less than the depth of the well region under the contact opening 19, because the dopants have to penetrate the isolation area 14 before penetrating the substrate 12 to form the well regions 20 located under the isolation area 14. Since the top surface of the last layer exposed to the active opening 19 is recessed compared to the top surface of the layer exposed to the areas between the photoresist features 18, the depth of the well region 20 under the contact opening 19 may penetrate the substrate 12 further than the penetration of the other well regions 20.

Since the photoresist features 18 are very closely spaced together, it is possible that some photoresist between the pattern features 18 will remain when patterning the photoresist layer 5. This is permissible provided the residual photoresist, if any, is thin enough to allow ion penetration through it when using the patterned photoresist layer 5 as a mask for ion implantation. The ion penetration is dependent upon the material properties of the underdeveloped photoresist. After implanting dopants, typical CMOS processing continues. For example, a gate oxide and a gate electrode may be formed on a portion of the semiconductor substrate 12 not shown in the figures. The sum total of all the heat applied for all the remaining processes of the semiconductor substrate 12 needs to allow for lateral diffusion of the dopants within the well region 20 to be greater than or approximately equal to half of the width of the photoresist features 18. In one embodiment, the width of at least one photoresist feature 18 does not exceed twice the lateral diffusion of well implants. One of ordinary skill in the art is capable of determining the width of which feature should be used when determining the amount of heat needed. Alternately, an anneal can be performed after ion implanting and before continuing with traditional processing.

Figure 4:
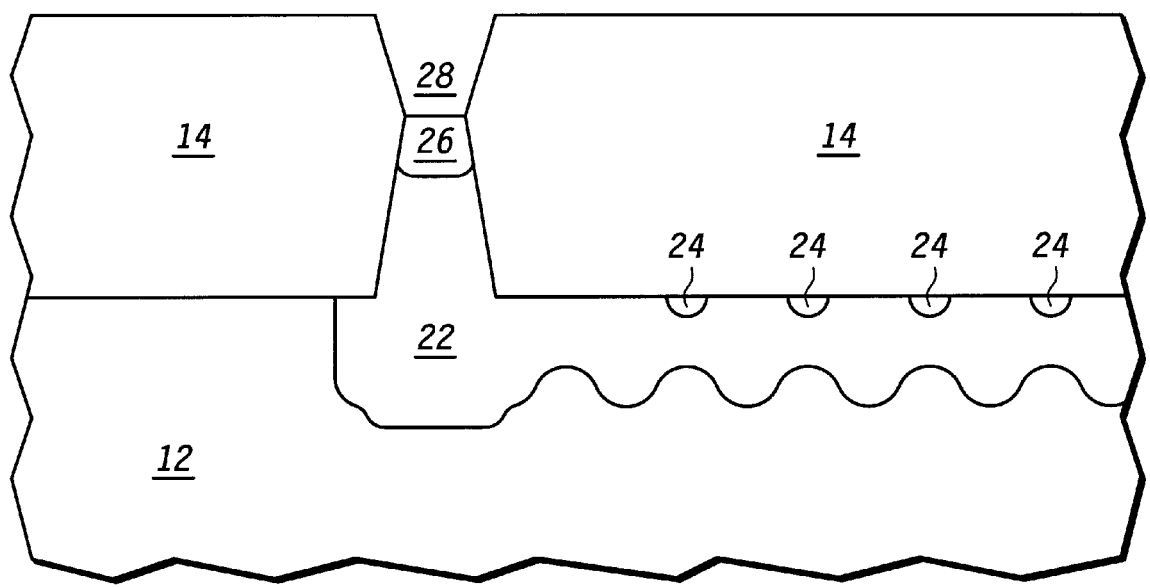
FIG. 4 illustrates the portion of the substrate in FIG. 3 after subsequent processing to form a well region and contact opening.

As shown in FIG. 4, the heat from the subsequent processing results in a merged well 22. The concentration of dopants within the merged well 22 that were originally under the photoresist features 18 will have a lower concentration of dopants compared to the areas of the merged well 22 that were not covered by the photoresist features 18. The doping concentration within the merged well 22, will have a local variation that depends on the shape and spacing of the photoresist features 18 as well as on the temperatures used in the specific process technology. By using photoresist features 18 to form the merged well 22, an increased overall resistivity of the merged well 22 compared to the well of the same dimensions formed without the photoresist features 18 results. Also, the concentration of dopants that were within the well regions 20 is greater than the average doping concentration of the merged well 22.

In one embodiment, void regions 24 may be formed under the photoresist features 18, when the merged well 22 is formed. These undoped void regions 24 are most likely to occur when the implants form a retrograde well profile. A retrograde well profile has higher doping at the bottom of the well as compared to the top of the well. While undesirable, these voids are typically very small and do not affect resistor electrical performance. If the voids merge together, however, they may decrease the device performance.

Shown in FIG. 4, after or while forming the merged well 22 an active region 26 is formed by ion implantation below an active opening 28. In the embodiment where the substrate 12 is P-type and the merged well 22 is N-type, the active region 26 will be N+.

The high resistance wells formed in the described embodiments consume less space than the traditional resistors with the same resistance, which are used in traditional wells. Thus, the described embodiments allow for the ability to shrink the resistor and, therefore, the die size. Furthermore, the high resistance well has the benefit of providing better ESD performance without requiring add additional processing steps.

Although the invention has been described with respect to specific conductivity types or polarity of potentials, skilled artisans appreciated that conductivity types and polarities of potentials may be reversed.

In the foregoing specification, the invention has been described with reference to specific embodiments. However, one of ordinary skill in the art appreciates that various modifications and changes can be made without departing from the scope of the present invention as set forth in the claims below. Although the embodiments are described in regards to forming an under isolation well resistor, the invention can also be used in other applications. For example, the wells can be formed to form high-resistance, high-breakdown, and high-voltage wells. In addition, the invention can be used to form ESD diodes. Furthermore, a skilled artisan recognizes that the features 18 can be other suitable materials besides photoresist. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of making a resistor with a process that provides a lateral diffusion of well implants of at least a first dimension, the resistor formed in a substrate having an isolation region overlying a semiconductor layer, comprising:

forming a patterned layer of photoresist over the isolation region, wherein the photoresist is patterned in a series of photoresist features each having a length dimension and a width dimension, wherein the width dimension does not exceed twice the first dimension;

implanting into the semiconductor layer using the patterned layer of photoresist as a mask to form doped regions in the semiconductor layer; and performing the process to cause to the doped regions to merge to form a resistor.

2. The method of claim 1, wherein the resistor is formed of a merged region having an average doping concentration of a first magnitude, the doped regions having a doping concentration of a second magnitude, and the second magnitude is larger than the first magnitude.

3. The method of claim 2, wherein isolation region has a thickness of at least one micron.

4. The method of claim 3, wherein the implant is at an energy of at least 500 keV.

5. A method of making a device structure utilizing a process that provides a lateral diffusion of well implants of at least a first dimension and formed in a substrate having an isolation region overlying a semiconductor layer, comprising:

forming a plurality of well regions in the semiconductor layer in a region underlying the isolation region, the well regions spaced apart by an amount not exceeding twice the first dimension; and performing the process to cause to the well regions to merge to form a merged well.

6. The method of claim 5, wherein the well regions have a doping concentration of a first magnitude and the merged well has an average doping concentration of a second magnitude, the first magnitude being greater than the second magnitude.

7. The method of claim 6, wherein forming the plurality of well regions comprises:

forming a patterned layer of photoresist over the isolation region, wherein the photoresist is patterned in a plurality of photoresist features, each photoresist feature having a length dimension and a width dimension, wherein the width dimension does not exceed twice the first dimension; and implanting into the semiconductor layer using the patterned layer of photoresist as a mask to form the well regions.

8. The method of claim 6, wherein forming the plurality of well regions comprises:

forming a patterned layer of photoresist over the isolation region, wherein the photoresist is patterned to a checkerboard pattern of openings in the photoresist; and implanting into the semiconductor layer using the patterned layer of photoresist as a mask to form the well regions under the openings.

9. The method of claim 6, wherein the merged well has a length and a width and wherein the step of forming the plurality of well regions comprises:

forming a patterned layer of photoresist over the isolation region, wherein the photoresist is patterned in a series of photoresist features each having a length dimension and a width dimension, wherein the width dimension does not exceed twice the first dimension and the length dimension is substantially the same as the width of the merged well; and implanting into the semiconductor layer using the patterned layer of photoresist as a mask to formed doped regions in the semiconductor layer.

10. The method of claim 9, further comprising forming an active region at an end of the merged well.

11. The method of claim 10, further comprising forming a device structure in the merged well.

12. The method of claim 6, wherein the isolation region is at least one micron in thickness.

13. A method of making a merged well having a length and a width utilizing a process that provides a lateral diffusion of well implants of at least a first dimension, comprising:

providing a substrate having an isolation region overlying a semiconductor layer;

forming a patterned layer of photoresist over the isolation region, wherein the photoresist is patterned in a plurality of photoresist features each having a length dimension and a width dimension, wherein the width dimension of each photoresist feature does not exceed twice the first dimension and the length dimension is substantially the same as the width of the merged well;

implanting into the semiconductor layer using the patterned layer of photoresist as a mask to form well regions in the semiconductor layer; and performing the process to cause the well regions to merge to form a merged well.

14. The method of claim 13, wherein the well regions have a doping concentration of a first magnitude and the merged well has an average doping concentration of a second magnitude, wherein the first magnitude exceeds the second magnitude.

15. The method of claim 14, wherein the isolation region has a thickness of at least one micron.

16. The method of claim 14, wherein an energy of at least 500 keV is used to form the doping concentration of the first magnitude.

17. The method of claim 14, wherein the width dimension of each of the plurality of photoresist features is at a selected one of a plurality of magnitudes.

18. The method of claim 14, wherein the plurality of photoresist features are in consecutive order in relation to the magnitude of the width dimension.

19. The method of claim 14, wherein the photoresist has a density of not exceeding 2.0 grams per square centimeter.

* * * * *

UNITED STATES PATENT AND TRADEMARK OFFICE
CERTIFICATE OF CORRECTION

PATENT NO.     : 6,500,723 B1
DATED          : December 31, 2002
INVENTOR(S)    : Khazhinsky et al.

It is certified that error appears in the above-identified patent and that said Letters Patent is hereby corrected as shown below:

Column 5,
Lines 15 and 36, change "to cause to" to -- to cause --

Signed and Sealed this

Nineteenth Day of August, 2003

JAMES E. ROGAN
*Director of the United States Patent and Trademark Office*